US008879595B2

(12) United States Patent
Mawst et al.

(10) Patent No.: US 8,879,595 B2
(45) Date of Patent: Nov. 4, 2014

(54) QUANTUM CASCADE STRUCTURES ON METAMORPHIC BUFFER LAYER STRUCTURES

(75) Inventors: Luke J. Mawst, Sun Prairie, WI (US); Jeremy D. Kirch, Middleton, WI (US); Thomas F. Kuech, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 446 days.

(21) Appl. No.: 13/283,855

(22) Filed: Oct. 28, 2011

(65) Prior Publication Data
US 2013/0107903 A1    May 2, 2013

(51) Int. Cl.
*H01S 5/00* (2006.01)
*H01L 21/02* (2006.01)
*H01S 5/34* (2006.01)

(52) U.S. Cl.
CPC ...... *H01L 21/02505* (2013.01); *H01L 21/0251* (2013.01); *H01S 2304/04* (2013.01); *H01L 21/02466* (2013.01); *H01L 21/02395* (2013.01); *H01S 5/3402* (2013.01); *H01L 21/02461* (2013.01); *H01L 21/0262* (2013.01); *H01L 21/02546* (2013.01); *H01L 21/02463* (2013.01); *H01S 5/3403* (2013.01)
USPC .................. 372/43.01; 372/45.01; 372/46.01; 372/50.1

(58) Field of Classification Search
USPC .................................. 372/43.01, 45.01, 46.01
See application file for complete search history.

(56) References Cited

U.S. PATENT DOCUMENTS

| 5,387,796 A | 2/1995 | Joshi et al. |
| 6,232,138 B1 | 5/2001 | Fitzgerald et al. |
| 2010/0221512 A1 | 9/2010 | Lee et al. |
| 2012/0039350 A1* | 2/2012 | Botez et al. .............. 372/45.012 |

OTHER PUBLICATIONS

Shin et al. :Ultra-low temperature sensitive deep-well quantum cascade lasers ($\lambda$= 4.8 um) via uptapering conduction band edge of injector regions, Electronics Letters Jul. 2, 2009 vol. 45 No. 14.*
Lee et al.:High-quality metamorphic compositionally graded InGaAs buffers, Journal of Crystal Growth 312 (2010) 250-257).*
Xu et al., InGaAs/GaAsP/AlGaAs, deep-well, quantum-cascade light-emitting structures grown by metalorganic chemical vapor deposition, Journal of Crystal Growth, Dec. 14, 2007, vol. 310, pp. 2370-2376.
Kirch et al., Effects of antimony (Sb) incorporation on MOVPE grown in $InAs_yP_{1-y}$ metamorphic buffer layers on InP substrates, Journal of Crystal Growth, Jan. 15, 2011, vol. 315, Issue 1, p. 96-101.

(Continued)

*Primary Examiner* — Dung Nguyen
(74) *Attorney, Agent, or Firm* — Bell & Manning, LLC

(57) ABSTRACT

Semiconductor structures, quantum cascade structures and lasers including the structures are provided. The semiconductor structures include a substrate, a metamorphic buffer layer structure over the substrate, and a quantum cascade structure including a superlattice of quantum wells and barriers over the metamorphic buffer layer structure. The substrate may be GaAs and the quantum cascade structure may be an InGaAs/InAlAs superlattice, including one or more barriers of AlAs.

20 Claims, 3 Drawing Sheets

(56) References Cited

OTHER PUBLICATIONS

Kirch et al., Characteristics of step-graded $In_xGa_{1-x}As$ and $InGaP_ySb_{1-y}$ Metamorphic Buffer Layers on GaAs substrates, May 2011.

Kirch et al., InAs/InAsP Quantum Wells on $InAs_yP_{1-y}(Sb)$ Metamorphic Buffer Layers for Mid-IR Emission, Powerpoint presentation, May 30-Jun. 3, 2010, Lake Tahoe, Nevada.

Razeghi et al., Watt level performance of quantum cascade lasers in room temperature continuous wave operation at $\lambda \sim 3.76$ µm, Applied Physics Letters, vol. 97, Oct. 1, 2010, pp. 131117-1-131117-3.

Bismuto et al., High power Sb-free quantum cascade laser emitting at 3.3 µm above 350 K, Applied Physics Letters, May 9, 2011, vol. 98, No. 191104.

Shin et al., Ultra-low temperature sensitive deep-well quantum cascade lasers ($\lambda = 4.8$ µm) via uptapering conduction band edge of injector regions, Electronics Letters, Jul. 2, 2009, vol. 45, No. 14, p. 741-743.

Shin et al., Highly temperature insensitive, deep-well 4.8 µm emitting quantum cascade semiconductor lasers, Appl. Phys. Lett., May 2009, vol. 94, No. 201103.

International Search Report and Written Opinion issued in PCT/US2012/060502, Mar. 20, 2013.

Sung et al., Near-infrared wavelength intersubband transitions in high indium content InGaAs/AlAs quantum wells grown on GaAs, Electronics Letters, vol. 33, No. 9, Apr. 24, 1997, pp. 818-820.

Liu et al., High-performance strain-compensated InGaAs/InAlAs quantum cascade lasers, Semicond. Sci. Technol. vol. 15, 2000, pp. L44-L46.

Goldman et al., Effects of GaAs substrate misorientation on strain relaxation in $In_xGa_{1-x}As$ films and multilayers, Journal of Applied Physics, vol. 83, No. 10, May 15, 1998, pp. 5137-5149.

Lee et al., High-quality metamorphic compositionally graded InGaAs buffers, Journal of Crystal Growth, vol. 312, Oct. 28, 2009, pp. 250-257.

Takano et al., Threading Dislocations and Phase Separation in InGaAs Layers on GaAs Substrates Grown by Low-Temperature Metalorganic Vapor Phase Epitaxy, Japanese Journal of Applied Physics, vol. 44, No. 9A, Sep. 8, 2005, pp. 6403-6411.

Quitoriano et al., Relaxed, high-quality InP on GaAs by using InGaAs and InGaP graded buffers to avoid phase separation, Journal of Applied Physics, vol. 102, No. 033511, Aug. 10, 2007, pp. 1-17.

\* cited by examiner

| | Type | Ga, Al Fraction | Thickness (Å) | Lattice Constant (Å) | Strain | Strain*Thickness (Å) |
|---|---|---|---|---|---|---|
| 106 | InGaAs | 0.576 | 28 | 5.8250624 | -0.008698507 | -0.2435582 |
| | InAlAs | 0.886 | 17 | 5.7058606 | 0.011943105 | 0.203032782 |
| | InGaAs | 0.596 | 25 | 5.8169604 | -0.007295522 | -0.182388053 |
| | InAlAs | 0.886 | 17 | 5.7058606 | 0.011943105 | 0.203032782 |
| | InGaAs | 0.596 | 24 | 5.8169604 | -0.007295522 | -0.175092531 |
| | InAlAs | 0.834 | 20 | 5.7265514 | 0.008360177 | 0.167203537 |
| | InGaAs | 0.635 | 21 | 5.8011615 | -0.004559701 | -0.095753728 |
| | InAlAs | 0.834 | 22 | 5.7265514 | 0.008360177 | 0.18392389 |
| 102 | InGaAs | 0.635 | 19 | 5.8011615 | -0.004559701 | -0.086634325 |
| | InAlAs | 0.834 | 23 | 5.7265514 | 0.008360177 | 0.192284067 |
| | InGaAs | 0.635 | 17 | 5.8011615 | -0.004559701 | -0.077514923 |
| | InAlAs | 0.834 | 25 | 5.7265514 | 0.008360177 | 0.209004421 |
| | InGaAs | 0.635 | 16 | 5.8011615 | -0.004559701 | -0.072955221 |
| | InAlAs | 0.834 | 28 | 5.7265514 | 0.008360177 | 0.234084951 |
| | InGaAs | 0.635 | 16 | 5.8011615 | -0.004559701 | -0.072955221 |
| 104 | InAlAs | 0.834 | 28 | 5.7265514 | 0.008360177 | 0.234084951 |
| | InAlAs | 0.886 | 11 | 5.7058606 | 0.011943105 | 0.131374153 |
| | InGaAs | 0.547 | 11 | 5.8368103 | -0.010732835 | -0.11806119 |
| | InAlAs | 0.886 | 11 | 5.7058606 | 0.011943105 | 0.131374153 |
| | InGaAs | 0.548 | 39 | 5.8364052 | -0.010662686 | -0.415844761 |
| | InAlAs | 0.886 | 9 | 5.7058606 | 0.011943105 | 0.107487943 |
| | InGaAs | 0.47 | 33 | 5.868003 | -0.016134328 | -0.532432816 |
| | InAlAs | 1 | 9 | 5.6605 | 0.019797985 | 0.178181869 |
| | InGaAs | 0.47 | 33 | 5.868003 | -0.016134328 | -0.532432816 |
| | InAlAs | 1 | 22 | 5.6605 | 0.019797985 | 0.435555679 |

FIG. 2

QUANTUM CASCADE STRUCTURES ON METAMORPHIC BUFFER LAYER STRUCTURES

REFERENCE TO GOVERNMENT RIGHTS

This invention was made with government support under W911NF-05-1-0262 and W911NF-09-2-0008 awarded by the ARMY/ARO. The government has certain rights in the invention.

BACKGROUND

Conventional quantum cascade lasers (QCLs) are composed of a superlattice of quantum wells (QWs) and barriers of fixed composition. That is, the composition of the QWs is the same and the composition of the barriers is the same. For conventional QCLs optimized for high continuous-wave (CW) power and emitting in the 4.6 to 4.8 μm range, there is substantial thermally activated carrier leakage from the upper laser level to the continuum. The leakage is evidenced by highly temperature sensitive electro-optical characteristics at and above room temperature (RT). That is, the characteristic temperature coefficient, $T_0$, for the threshold-current density, $J_{th}$, is found to have relatively low values of ~140 K for 4.6 μm emitting devices (ideal $T_0$ values are ~300 K). See A. Lyakh, C. Pflugl, L. Diehl et al., *Appl. Phys. Lett.* Vol. 92, p. 111110, 2008; Y. Bai, S. R. Darvish, S. Slivken, et al., *Appl. Phys. Lett.*, Vol. 92, p. 101105, 2008; D. Botez, J. C. Shin, L. J. Mawst et al., *Proc. SPIE*, Vol. 7616, 76160N, February 2010. The characteristic temperature coefficient, $T_1$, for the slope efficiency, $\eta_d$, is also found to have relatively low values of ~140 K for 4.6 μm emitting devices over the 20-90° C. temperature range. See A. Lyakh, C. Pflugl, L. Diehl et al., *Appl. Phys. Lett.* Vol. 92, p. 111110, 2008. Thus, even for buried-heterostructure devices; that is, structures with optimal heat removal, the strong temperature sensitivity of their electro-optical characteristics has not allowed for optimal performance. For instance, at 4.6 μm the best results at RT are 12.7% maximum CW wallplug efficiency, far short of the theoretically predicted upper limit of 28%. See A. Lyakh, R. Maulini, A. Tsekoun, et al., *Appl. Phys. Lett.* Vol. 95, p. 141113 (2009); J. Faist, *Appl. Phys. Lett.* Vol. 90, p. 253512 (2007). As the emission wavelength decreases below 4.5 μm, the problem of thermally activated carrier leakage becomes even more challenging. Conventional QCLs operating below 4.5 μm exhibit $T_1$ values as low as 29 K and RT CW wallplug efficiencies of 1%. See J. S. Yu et al., *Appl. Phys. Lett.*, 88, 251118 (2006); J. S. Yu et al., *Appl. Phys. Lett.*, 88, 041111 (2006).

Some state-of-the-art QCLs have been developed which exhibit lower carrier leakage, higher $T_0$ and $T_1$ values and improved RT maximum CW wallplug efficiencies. See, e.g., Shin, J. C. et al., *Ultra-low temperature sensitive deep-well quantum cascade lasers (λ=4.8 μm) via uptapering conduction band edge of injector regions*, Electronics Letters, Jul. 2, 2009, Vol. 45, No. 14. These state-of-the-art QCLs are InP-based devices composed of a superlattice of QWs and barriers in which the composition of the QWs varies and the composition of the barriers varies, allowing for strategically positioned deeper (in energy) quantum wells and taller (in energy) barriers. However, the range of compositions and thicknesses that can be accessed for the quantum wells and barriers is limited by strain-thickness considerations in order to avoid strain relaxation in the many layers (500-900 or more) of highly strained materials that are needed in practical devices. As the critical thicknesses for strain relaxation are approached, device reliability is likely to deteriorate through thermally activated relaxation processes. Thus, the emission wavelength for these state-of-the-art QCLs remains in the range of about 4.6 to 4.8 μm.

Some InP-based devices have been developed which make use of highly strained materials for the quantum wells and barriers of the superlattice. See, e.g., Bandyopadhyay, N. et al., *Watt level performance of quantum cascade lasers in room temperature continuous wave operation at λ~3.76 μm*, Applied Physics Letters, 97, 131117 (2010); Bismuto, M. et al., *High power Sb-free quantum cascade laser emitting at 3.3 μm above 350 K*, Applied Physics Letters, 98, 191104 (2011). Although some of these devices may achieve short wavelength emission, the performance of the devices is poor as evidenced by low $T_0$ and $T_1$ values and low CW powers and efficiencies (or only pulsed operation). In addition, as noted above, device reliability may deteriorate due to the use of highly strained materials.

SUMMARY

Provided herein are semiconductor structures, devices incorporating the semiconductor structures and methods for making the semiconductor structures.

The semiconductor structures include a substrate, a metamorphic buffer layer structure over the substrate and a quantum cascade structure over the metamorphic buffer layer structure. Certain aspects of the invention are based, at least in part, on the inventors' findings that metamorphic buffer layer structures may be used to broaden the compositional and thickness ranges that have been previously utilized for the quantum wells and barriers of quantum cascade structures. Other aspects are based, at least in part, on the inventors' findings of certain compositional ranges for the quantum wells and barriers of quantum cascade structures that achieve emission wavelengths of 4.5 μm or less and strong carrier confinement without excessive strain in the quantum wells and barriers. At least some embodiments of the disclosed semiconductor structures and quantum cascade structures are capable of providing quantum cascade lasers exhibiting improved electro-optical characteristics, higher CW power and higher CW wallplug efficiencies, including higher CW power and wallplug efficiencies at room temperature, as compared to conventional and state-of-the-art QCLs. In addition, the disclosed semiconductor structures and quantum cascade structures may be formed on low cost, large area GaAs substrates.

The disclosed semiconductor structures and quantum cascade structures find use in a variety of applications including environmental monitoring, chemical sensing including remote sensing, free-space optical communications, healthcare, materials processing, laser range-finding and and infrared countermeasure systems.

As noted above, in one aspect, semiconductor structures are provided which include a substrate, a metamorphic buffer layer structure over the substrate and a quantum cascade structure over the metamorphic buffer layer structure. The quantum cascade structure includes an electron injector, an active region adjacent to the electron injector, and an electron extractor adjacent to the active region, wherein each of the electron injector, active region and electron extractor comprise a superlattice of quantum wells and barriers. The compositions of the quantum wells and barriers may vary. Exemplary compositions are described below. The quantum cascade structures may be characterized by a variety of properties, including strain*thickness values, energy band offsets and wavelengths of light and electro-optical characteristics provided by the structures under appropriate conditions.

Exemplary strain*thickness values, energy band offsets, wavelengths and electro-optical characteristics are described below. The particular arrangement (e.g., order) of the quantum wells and barriers may vary and exemplary arrangements are described below.

A variety of metamorphic buffer layer structures and substrates may be used. Exemplary metamorphic buffer layer structures and substrates are described below.

Also provided are the quantum cascade structures themselves, methods for forming the semiconductor structures, quantum cascade structures and metamorphic buffer layer structures. Also provided are laser devices incorporating the semiconductor structures and quantum cascade structures.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2 provides the composition of each layer of the quantum cascade structure of FIG. 1.

DETAILED DESCRIPTION

Figure 1:
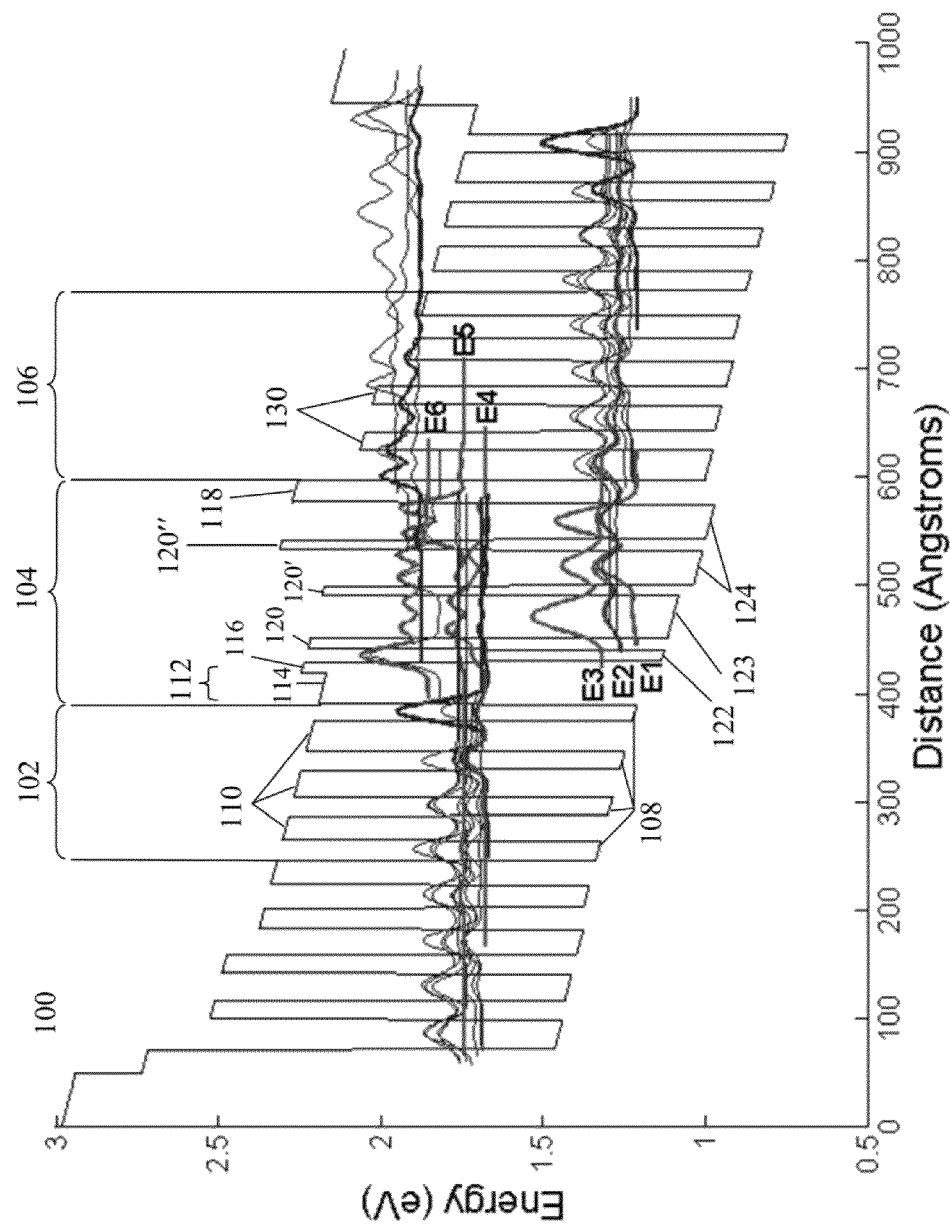
FIG. 1 depicts the energy band diagram of a quantum cascade structure of an illustrative embodiment of the disclosed semiconductor structures.

Provided herein are semiconductor structures, devices incorporating the semiconductor structures and methods for making the semiconductor structures. The semiconductor structures include a substrate, a metamorphic buffer layer structure over the substrate and a quantum cascade structure over the metamorphic buffer layer structure.

Quantum Cascade Structures

The disclosed quantum cascade structures include an electron injector, an active region adjacent to the electron injector and an electron extractor adjacent to the active region. Each of the electron injector, active region and electron extractor includes a superlattice of quantum wells and barriers. By "quantum cascade structure," it is meant a structure that emits photons when electrons within a given energy band relax between the quantized states of an active region within the structure. Thus, quantum cascade structures are characterized by intersubband (or intraband) transitions. Quantum cascade structures are distinguished from interband structures which emit photons when electrons and holes recombine with the active layers of such structures. The fundamental differences in operation between intersubband (i.e., quantum cascade) structures and interband structures result in different design considerations for the different types of structures. In addition, although interband lasers have demonstrated room temperature CW operation at short mid-IR wavelengths (i.e., 3-4 µm), they are inherently low CW output-power devices due to low $T_0$ values (~50 K) resulting from strong Auger recombination.

The superlattices of the disclosed quantum cascade structures include layers of semiconductor configured to provide alternating quantum wells and barriers. The composition of the quantum wells and barriers may vary. By "composition" it is meant chemical composition. By contrast to conventional quantum cascade structures (in which the composition of the quantum wells is the same and the composition of the barriers is the same), in the disclosed quantum cascade structures, the composition of a particular quantum well may be different from that of another quantum well. Similarly, the compositions of the barriers in the disclosed quantum cascade structures may be different from one another.

In addition, in the disclosed quantum cascade structures, the compositions of the quantum wells and barriers may include compositions which are lattice mismatched to the substrate of the semiconductor structure. Because lattice mismatch between a substrate and semiconductor layers grown over the substrate can result in poor quality growth and excessive strain (which may lead to relaxation and deterioration in device performance as noted above), the design of at least some conventional or state-of-the-art quantum cascade structures (e.g., GaAs-based devices) involves selecting those compositions (and, possibly, thicknesses) which minimize lattice mismatch with the substrate and strain within the structure.

By contrast, in some embodiments of the disclosed quantum cascade structures, the composition of one or more quantum wells or one or more barriers or both is characterized by a lattice constant which differs from the lattice constant of the substrate by at least 2%, at least 2.5%, at least 3%, at least 3.5%, at least 3.8%, at least 4%, at least 4.5%, at least 5%, at least 5.5%, or at least 6%.

In some embodiments, the composition of the quantum wells or barriers or both are characterized by a lattice constant which differs from the lattice constant of the substrate by an amount in the range of 0% to 6%. This includes embodiments in which the range is 0% to 5%, 0% to 4%, 0% to 3%, 0% to 2%, 0.05% to 6%, 0.1% to 6%, 0.5% to 6%, 1% to 6%, 3% to 6%, 4% to 6%, 0.05% to 5%, 0.1% to 5%, 0.5% to 5%, 1% to 5%, 3% to 5%, 0.05% to 4%, 0.1% to 4%, 0.5% to 4%, 1% to 4%, 3% to 4%, 0.05% to 3%, 0.1% to 3%, 0.5% to 3%, 1% to 3%, 0.05% to 2%, 0.1% to 2%, 0.5% to 2%, or 1% to 2%.

The quantum wells and/or barriers which exhibit any of the disclosed lattice constants may be those in the active region, the electron injector, the electron extractor, or combinations thereof, including each of the quantum wells and barriers in the quantum cascade structure.

The quantum cascade structure may include quantum wells and barriers composed of group III/V alloys. In some embodiments, the quantum cascade structure includes quantum wells of InGaAs. It is to be understood that InGaAs refers to an alloy of indium, gallium and arsenic, in which the relative proportions of the indium and gallium may vary.

In some embodiments, the quantum cascade structure includes quantum wells of $In_xGa_{1-x}As$ wherein $0.10 \leq x \leq 0.80$. This includes embodiments in which $0.15 \leq x \leq 0.55$, $0.20 \leq x \leq 0.60$, $0.25 \leq x \leq 0.65$, $0.30 \leq x \leq 0.70$, $0.35 \leq x \leq 0.75$, or $0.40 \leq x \leq 0.80$. In some embodiments, the quantum cascade structure includes quantum wells of $In_xGa_{1-x}As$ wherein $0.36 \leq x \leq 0.65$. This includes embodiments in which $0.36 \leq x \leq 0.45$, $0.36 \leq x < 0.50$, $0.36 \leq x \leq 0.50$, $0.36 \leq x \leq 0.55$, $0.36 \leq x < 0.60$, $0.36 \leq x \leq 0.60$, $0.40 \leq x \leq 0.60$, or $0.40 < x \leq 0.60$.

The quantum wells having any of the disclosed compositions may be each of the quantum wells in the quantum cascade structure or certain of the quantum wells in the active region, electron injector, or electron extractor. In some embodiments, at least one quantum well of the active region is $In_{0.53}Ga_{0.47}As$. In some embodiments, at least two quantum wells of the active region are $In_{0.53}Ga_{0.47}As$. Conventional or state of the art GaAs-based devices having InGaAs quantum wells minimize the In content of the quantum wells.

By contrast, the disclosed quantum cascade structures may include quantum wells with significantly higher In content.

In some embodiments, the quantum cascade structure includes barriers of InAlAs. It is to be understood that InAlAs refers to an alloy of indium, aluminum and arsenic in which the relative proportions of indium and aluminum may vary. In some embodiments, the quantum cascade structure includes barriers of InAlAs, AlAs, or both.

In some embodiments, the quantum cascade structure includes barriers of $In_yAl_{1-y}As$ wherein $0 \leq y \leq 0.40$. This includes embodiments in which $0 \leq y \leq 0.35$, $0 \leq y \leq 0.30$, $0 \leq y \leq 0.25$, $0 \leq y \leq 0.20$, $0 \leq y < 0.20$, $0 \leq y \leq 0.17$, $0 \leq y \leq 0.15$, or $0 \leq y \leq 0.11$.

The barriers having any of the disclosed compositions may be each of the barriers in the quantum cascade structure or certain of the barriers in the active region, electron injector, or electron extractor. In some embodiments, at least one barrier of the active region is AlAs. In some embodiments, at least two barriers of the active region are AlAs. Conventional or state-of-the-art InP-based devices having InAlAs barriers minimize the Al content of the barriers. Alternatively, the thickness of higher Al content barriers is minimized as further discussed below. By contrast, the disclosed quantum cascade structures may include barriers with significantly higher Al content, including thick barriers with significantly higher Al content.

In some embodiments, the quantum cascade structure includes barriers of AlGaAs. It is to be understood that AlGaAs refers to an alloy of aluminum, gallium and arsenic in which the relative proportions of aluminum and gallium may vary. In some embodiments, the quantum cascade structure includes barriers of AlGaAs, GaAs, or both.

In some embodiments, the quantum wells of the quantum cascade structure are InGaAs and the barriers are InAlAs, AlAs, or both. In some embodiments, the quantum wells are $In_xGa_{1-x}As$ and the barriers are $In_yAl_{1-y}As$, wherein $0.30 \leq x \leq 0.70$ and $0 \leq y \leq 0.30$. By contrast, conventional or state-of-the-art GaAs-based devices would not utilize a combination of InGaAs quantum wells and InAlAs barriers since the InAlAs barriers (or AlAs barriers) would not provide the necessary strain compensation.

It is to be understood that quantum cascade structures having various combinations of quantum wells and barriers having any of the compositions disclosed above are possible.

The thicknesses of the quantum well and barrier layers may vary. In some embodiments, at least one barrier of the active region is AlAs and is characterized by a thickness of at least 5 Å, at least 10 Å, at least 15 Å, at least 20 Å or at least 25 Å. As noted above, even for those conventional or state-of-the-art InP-based devices having high Al content InAlAs barriers, the thickness of such barriers is minimized.

The quantum wells and barriers of the disclosed quantum cascade structures may be characterized by the product of strain and thickness (strain*thickness). The strain*thickness values may vary depending upon at least the composition and thickness of the quantum wells and barriers. In some embodiments, the quantum cascade structure includes quantum wells of InGaAs which are compressively strained and are characterized by a strain*thickness value of no more than 1.2 Å, no more than 1.0 Å, no more than 0.80 Å, no more than 0.60 Å, no more than 0.55 Å, no more than 0.50 Å, or no more than 0.45 Å. In some embodiments, the quantum cascade structure includes quantum wells of InGaAs which are compressively strained and are characterized by a strain*thickness value in the range of 0 Å to 1.2 Å. This includes embodiments in which the strain*thickness value is in the range of 0 Å to 1.0 Å, 0 Å to 0.8 Å, 0 Å to 0.6 Å, 0.01 Å to 1.2 Å, 0.05 Å to 1.2 Å, 0.1 Å to 1.2 Å, 0.05 Å to 1.0 Å, 0.5 Å to 0.8 Å, 0.05 Å to 0.6 Å, 0.1 Å to 1.0 Å, 0.1 Å to 0.8 Å, 0.1 Å to 0.6 Å, 0.05 Å to 0.30 Å, or 0.10 Å to 0.30 Å.

The quantum wells having any of the disclosed strain*thickness values may be each of the quantum wells in the quantum cascade structure or certain of the quantum wells in the active region, electron injector, or electron extractor. In some embodiments, the quantum wells of the active region are InGaAs, are compressively strained and are characterized by a strain*thickness value of no more than 0.60 Å. In some such embodiments, the strain*thickness value is in the range of 0.1 Å to 0.60 Å.

In some embodiments, the quantum cascade structure includes barriers of InAlAs, AlAs, AlGaAs, GaAs, or combinations thereof which are tensilely strained and are characterized by a strain*thickness value of no more than 0.60 Å, no more than 0.55 Å, no more than 0.50 Å, no more than 0.45 Å, no more than 0.44 Å, or no more than 0.43 Å. In some embodiments, the quantum cascade structure includes barriers of InAlAs, AlAs, AlGaAs, GaAs, or combinations thereof which are tensilely strained and are characterized by a strain*thickness value in the range of 0 Å to 0.6 Å. This includes embodiments in which the strain*thickness value is in the range of 0 Å to 0.5 Å, 0 Å to 0.4 Å, 0.01 Å to 0.6 Å, 0.05 Å to 0.6 Å, 0.1 Å to 0.6 Å, 0.1 Å to 0.5 Å, 0.1 Å to 0.4 Å, or 0.1 Å to 0.3 Å.

The barriers having any of the disclosed strain*thickness values may be each of the barriers in the quantum cascade structure or certain of the barriers in the active region, electron injector, or electron extractor. In some embodiments, the barriers of the active region are InAlAs or AlAs or both, are tensilely strained and are characterized by a strain*thickness value of no more than 0.46 Å. In some such embodiments, the strain*thickness value is in the range of 0.1 Å to 0.46 Å.

It is to be noted that the strain*thickness values disclosed above are determined relative to an InGaAs metamorphic buffer layer structure.

Various combinations of quantum wells and barriers having the strain*thickness values disclosed above are possible. The strain*thickness values disclosed above are significantly less than strain*thickness values of many conventional or state-of-the-art InP-based short wavelength (i.e., 3-4 μm) devices. At the same time, the strain*thickness values disclosed above are more than would be utilized in conventional or state-of-the-art GaAs-based devices. The disclosed quantum cascade structures may be further distinguished from certain quantum cascade structures (e.g., conventional or state-of-the-art GaAs-based devices) in that the strain compensation of the disclosed quantum cascade structures may be uniform. By "uniform," it is generally meant that each compressively strained quantum well is adjacent to tensilely strained barriers throughout the quantum cascade structure. By contrast, strain compensation in conventional or state-of-the-art GaAs-based devices is often non-uniform. For example, such devices may use localized strain compensation via layers of appropriately strained semiconductor in one region of the device (e.g., the electron injector or electron extractor) to compensate for strain in another region of the device (e.g., the active region).

The arrangement (e.g., order) of the quantum wells and barriers having any of the compositions described above may vary within the disclosed quantum cascade structures in order to achieve certain emission wavelengths and to suppress carrier leakage. Possible arrangements are disclosed in U.S. Ser. No. 12/855,476, which is incorporated by reference in its entirety. In some embodiments, the quantum wells of the active region are deep quantum wells. By "deep quantum well" it is meant a quantum well having a well bottom that is lower in energy than the well bottoms of the quantum wells in the adjacent electron injector. A deep quantum well will have a well bottom that is lower in energy than the well bottoms of the quantum wells in the adjacent electron injector regardless of whether or not the quantum cascade structure is under the influence of an applied electric field. That is, a deep quantum well will have a well bottom that remains lower in energy than the well bottoms of the quantum wells in the adjacent electron injector when the quantum cascade structure is unbiased. In some such embodiments, at least one quantum well of the active region also has a well bottom that is lower in energy than the well bottom of another deep quantum well of the active region. Such a quantum well may be referred to as a "very deep quantum well." Again, a very deep quantum well will have a well bottom that remains lower in energy than the well bottom of another deep quantum well when the quantum cascade structure is unbiased. In other embodiments, at least two quantum wells of the active region (e.g., a first and second quantum well) also have well bottoms that are lower in energy than the well bottom of another deep quantum well of the active region (e.g., a third quantum well). The well bottom of the first quantum well may have the same energy or a different energy (e.g., a lower energy) than the well bottom of the second quantum well. One specific, exemplary arrangement of the quantum wells and barriers of a quantum cascade structure is shown in FIGS. 1 and 2 and is described below.

The disclosed quantum cascade structures may be further characterized by an energy band offset. The energy band offset may vary depending, at least in part, upon the particular arrangement and composition of the quantum wells and barriers of the active region. In some embodiments, the energy band offset is defined as the difference in energy between the top of the exit barrier of the active region and the bottom of the adjacent, upstream quantum well. In some embodiments, quantum cascade structure is characterized by an energy band offset of at least 1.1 eV. This includes embodiments in which the energy band offset is at least 1.15 eV, at least 1.20 eV, at least 1.22 eV, at least 1.24 eV, at least 1.25 eV, at least 1.26 eV, at least 1.28 eV, at least 1.30 eV, at least 1.35 eV, or at least 1.40 eV. In some such embodiments, the energy band offset is within the ranges disclosed above and the exit barrier is tensilely strained and is characterized by a strain*thickness value of no more than 0.60 Å, no more than 0.55 Å, no more than 0.50 Å, no more than 0.45 Å, no more than 0.44 Å, or no more than 0.43 Å and/or the adjacent, upstream quantum well is compressively strained and is characterized by a strain*thickness value of no more than 1.2 Å, no more than 1.0 Å, no more than 0.80 Å, no more than 0.60 Å, no more than 0.55 Å, no more than 0.50 Å, or no more than 0.45 Å. Such large energy band offsets have not been achieved in conventional or state-of-the-art QCLs in which the exit barrier and/or the adjacent, upstream quantum well are characterized by a similar amount of strain. Moreover, such large energy band offsets have not been achieved in conventional or state-of-the-art GaAs based devices.

The disclosed quantum cascade structures may be further characterized by the wavelength of light emitted by the structures under the appropriate conditions (e.g., under an applied electric field). The wavelength of light will depend upon the particular arrangement and composition of the quantum wells and barriers of the active region. In some embodiments, the quantum cascade structure is characterized by an ability to emit light at a wavelength of 4.5 µm or less. This includes embodiments in which the wavelength is 4.4 µm or less, 4.3 µm or less, 4.2 µm or less, 4.1 µm or less, 4.0 µm or less, 3.9 µm or less, or 3.8 µm or less. In some embodiments, the quantum cascade structure is characterized by an ability to emit light at a wavelength in the range of from 3.0 µm to 4.5 µm. This includes wavelengths in the range of from 3.5 µm to 4.5 µm, 3.5 µm to 4.4 µm, 3.5 µm to 4.3 µm, 3.5 µm to 4.2 µm, or 3.8 µm to 4.2 µm. In some embodiments, the light emitted by the structures under the appropriate conditions is lasing light.

The disclosed quantum cascade structures may be further characterized by other properties achieved by the structures (e.g., when incorporated into laser devices), such as $T_0$, $T_1$, maximum continuous-wave (CW) power ($P_{CW,max}$) at room temperature and the maximum CW wallplug efficiency ($\eta_{wp, max}$) at room temperature. Equations for calculating these properties may be found in D. Botez, J. C. Shin, L. J. Mawst et al., *Proc. SPIE*, Vol. 7616, 76160N, February 2010; D. Botez, S. Kumar, J. C. Shin, L. J. Mawst et al, *Appl. Phys. Lett.* Vol. 97, p. 071101 (2010); D. Botez, J. C. Shin, S. Kumar et al., *Proc. SPIE*, Vol. 7953, Paper 76530N, February 2011. In some embodiments, the quantum cascade structures are characterized by a $T_0$ value of at least 200 K, at least 220 K, at least 240 K, at least 260 K, at least 280 K, or at least 290 K. In some embodiments, the quantum cascade structures are characterized by a $T_1$ value of at least 200 K, at least 220 K, at least 240 K, at least 260 K, at least 280 K or at least 290 K. In some embodiments, the quantum cascade structures are characterized by a $P_{CW,max}$ value at room temperature of at least 1.5 W, at least 1.8 W, at least 2.0 W, at least 2.3 W, at least 2.6 W, at least 2.9 W, at least 3 W, at least 3.1 W, at least 3.2 W, or at least 3.3 W. In some embodiments, the quantum cascade structures are characterized by a $\eta_{wp, max}$ value at room temperature of at least 10%, at least 12%, at least 14%, at least 16%, at least 18%, at least 20%, at least 22%, or at least 24%. Quantum cascade structures characterized by various combinations of these properties (including any of the disclosed wavelength ranges) are possible.

The energy band diagram of a quantum cascade structure 100 of an illustrative semiconductor structure is shown in FIG. 1. FIG. 2 shows the compositions of each of the semiconductor layers of the quantum cascade structure as well as the thickness (in Å), the lattice constant (in Å), strain (determined relative to the metamorphic buffer layer structure), and strain*thickness value (in Å, determined relative to the metamorphic buffer layer structure) of each layer. A negative strain*thickness value denotes compressive strain; a positive value denotes tensile strain. The quantum cascade structure overlies an $In_xGa_{1-x}As$ step-graded metamorphic buffer layer, wherein x is graded from 0 to 0.3 (not shown). The top-most layer of the metamorphic buffer layer structure has a lattice constant of 5.77483 Å, assuming Vegard's law. The metamorphic buffer layer structure overlies a GaAs substrate (not shown). The quantum cascade structure includes an electron injector 102, an active region 104 adjacent to the electron injector, and an electron extractor 106 adjacent to the active region. The electron injector includes a strained superlattice structure of $In_{0.365}Ga_{0.635}As$ quantum wells 108 and $In_{0.166}Al_{0.834}As$ barriers 110. The active region includes an injection barrier 112, which is a composite injection barrier including a first barrier layer 114 and a second barrier layer 116. The energy of the composite injection barrier has an intermediate value between the energy of the first barrier layer and the energy of the second barrier layer. The active region also includes an exit barrier 118 and intermediate barriers 120, 120' and 120". The quantum wells 122, 123 and 124 of the active region are deep quantum wells of either $In_{0.453}Ga_{0.547}As$ (122), $In_{0.452}Ga_{0.548}As$ (123) or $In_{0.53}Ga_{0.47}As$ (124). Two of the quantum wells 124 are very deep quantum wells of $In_{0.53}Ga_{0.47}As$. Two intermediate barriers 120 and 120' are $In_{0.114}Al_{0.886}As$. The other intermediate barrier 120" and the exit barrier 118 are AlAs. The electron extractor 106 also includes barriers 130 of $In_{0.114}Al_{0.886}As$. Thus, the conduction-band edge is effectively tapered (in energy) both upstream and downstream of the active region.

By contrast to conventional and state-of-the-art QCLs based on any substrate, the quantum cascade structure 100 achieves short-wavelength emission and strong carrier suppression at moderate values of strain in the superlattice. The quantum cascade structure 100 is characterized by emission at a wavelength of 3.57 μm. The energy band offset of the quantum cascade structure is 1.3 eV. In addition, $\delta E_{ul}$, the energy difference between the upper lasing level (i.e., state 4) and the top of the exit barrier is 598 meV. As a result, the wavefunctions of the upper energy states 5 and 6 do not overlap with wavefunctions in the upper Γ miniband, such that escape to the upper miniband of the R/I region becomes negligible. Besides $\delta E_{ul}$, the other major factor affecting carrier leakage is the energy difference between the upper lasing level (state 4) and the next highest active-region state (state 5), $E_{54}$. An $E_{54}$ value of ~70 meV is obtained for the quantum cascade structure 100. Using the appropriate equations discussed above, values of $T_0$ and $T_1$ are estimated at 280 K. $P_{CW,max}$ at room temperature is estimated at 3 W and the room temperature CW $\eta_{wp,\,max}$ is estimated at 20%.

As noted above, the quantum cascade structures may be a component of the disclosed semiconductor structures. However, also provided are any of the quantum cascades structures themselves, which may have been released or lifted-off the metamorphic buffer layer structure and substrate upon which they were grown. Once released or lifted-off, the quantum cascade structures may be bonded to a new substrate material, e.g., a handle wafer. The quantum cascade structure would not be epitaxial with respect to the handle wafer.

Substrates

A variety of substrates may be used in the semiconductor structures. In some embodiments, the substrate includes or is GaAs.

Metamorphic Buffer Layer Structures

As noted above, the disclosed semiconductor structures include a metamorphic buffer layer structure between the substrate and the quantum cascade structure. The disclosed metamorphic buffer layer structures may be step-graded or continuous graded. The disclosed metamorphic buffer layer structures may include one or more layers of semiconductor. The disclosed metamorphic buffer layer structures are configured (e.g., the composition of the layer(s), number of layers and thickness of layer(s) is selected) to transition from the lattice constant of the underlying substrate to (or near to) the average lattice constant of the overlying quantum cascade structure while minimizing the number of threading-dislocations in the overlying layers of the quantum cascade structure. In a step-graded metamorphic buffer layer structure, the composition and number of the layers are selected to transition from the lattice constant of the underlying substrate to (or near to) the average lattice constant of the overlying quantum cascade structure in a fixed number of steps (i.e., layers). Accordingly, the composition and, thus, the lattice constant, of the metamorphic buffer layer structure is graded from one value at the bottom-most layer of the metamorphic buffer layer structure to another value at the top-most layer of the metamorphic buffer layer structure. The compositions, number of layers and thicknesses of the layers may vary depending on the selected substrate and the compositions used for the layers of the quantum cascade structure.

In some embodiments, the metamorphic buffer layer structure includes $In_xGa_{1-x}As$ wherein x is graded from 0 to a maximum value, which may vary. For example, the maximum value of x (i.e., indium content) may vary from 10% to 40%. This includes embodiments in which the maximum value is 35% 30%, 25%, 20%, or 15%. In some embodiments, the metamorphic buffer layer structure includes $In_xGa_{1-x}As$ wherein x graded from 0 to 0.3. In some embodiments, the metamorphic buffer layer structure includes step-graded $In_xGa_{1-x}As$, wherein x is graded from 0 to any of the disclosed maximum values. The step-size, or Δx, may vary. By way of example only, Δx may be 0.005, 0.01, or 0.05, although other values are possible. The thickness of the layers of the metamorphic buffer layer structure may vary. Exemplary suitable thicknesses include those in the range from 50 nm to 1 μm.

Although use of the disclosed metamorphic buffer layer structures reduces the threading-dislocation densities in the overlying layers of the quantum cascade structure by localizing misfit dislocations at internal interfaces (thereby preventing their propagation vertically through the overlying layers), strain relaxation also gives rise to a surface with significant tilt and a rough cross-hatched morphology. The underlying surface morphology of the metamorphic buffer layer structure can significantly degrade the interfacial structure and compositional uniformity of the overlying layers of the quantum cascade structure. Surface morphology is of greater significance to the operation of quantum cascade structures, which involve resonant tunneling processes, than it is for interband structures or other electronic devices.

Certain techniques may be used to improve the surface morphology of the metamorphic buffer layer structures. In some embodiments, the surface of the metamorphic buffer layer structure nearest the quantum cascade structure is characterized by a root-mean-square (RMS) of surface roughness of no more than 1 nm, no more than 1.5 nm, no more than 2.0 nm, no more than 2.5 nm, no more than 3.0 nm, no more than 3.5 nm, no more than 4.0 nm, no more than 4.5 nm, or no more than 5.0 nm.

In some embodiments, the metamorphic buffer layer structures incorporate Sb or Te as a surfactant to improve the surface morphology of the metamorphic buffer layer structures without noticeably altering the defect density in the overlying layers of the quantum cascade structure. In some embodiments, the metamorphic buffer layer structure includes $InGaP_{1-x}Sb_x$ wherein x is graded from 0 to 0.2. In such embodiments, the relative proportions of indium and gallium within the metamorphic buffer layer structure may vary. In some embodiments, the indium content is 0.485 and the gallium content is 0.515, although other relative proportions are possible. In some embodiments, the metamorphic buffer layer structure includes step-graded $InGaP_{1-x}Sb_x$ wherein x is graded from 0 to 0.2. The step-size, or Δx, may vary as described above. Thicknesses for the layers of the metamorphic buffer layer structure may vary as described above.

Figure 3:
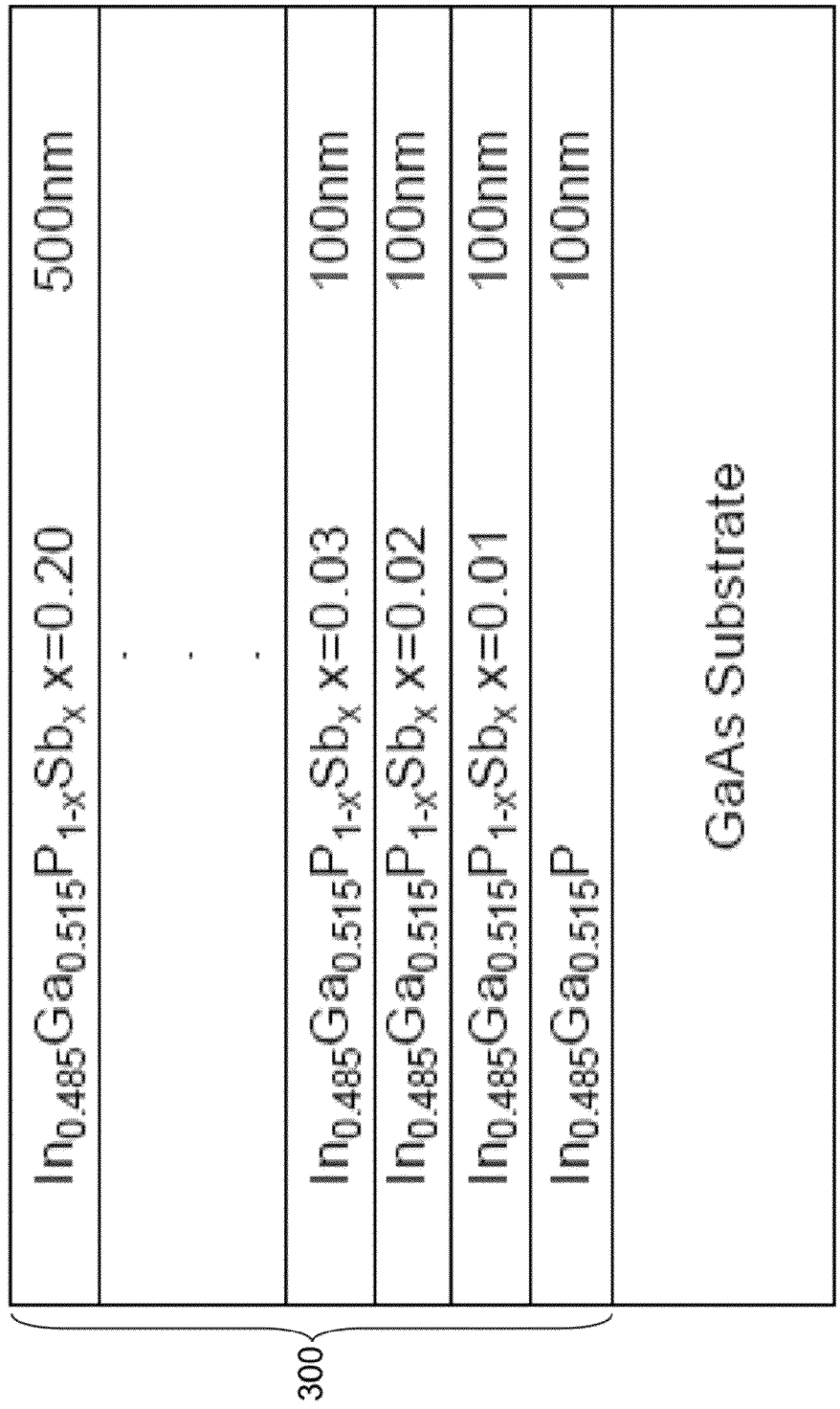
FIG. 3 depicts the metamorphic buffer layer structure of an illustrative embodiment of the disclosed semiconductor structures.

An exemplary metamorphic buffer layer structure 300, including the thicknesses of the layers, is shown in FIG. 3. Atomic force microscopy images of the metamorphic buffer layer structure of FIG. 3 indicate that the metamorphic buffer layer structure exhibits significantly lower surface roughness (~4.7 nm) as compared with step-graded $In_xGa_{1-x}As$ metamorphic buffer layer structures (>7 nm). In addition, measurement of the full-width-half-maximum (FWHM) of the X-ray diffraction (XRD) RSM diffraction peaks corresponding to the bulk top $InGaP_{1-x}Sb_x$ layer of the metamorphic buffer layer structure yield valuable information regarding the mosaic spread ($Q_x$ direction) and spread in lattice constant or strain ($Q_z$ direction) within the film. It is found that the FWHM of the diffraction peaks in the $Q_z$ direction from the top of the $In_{0.485}Ga_{0.515}P_{1-x}Sb_x$ metamorphic buffer layer structure are significantly narrower (about a factor of 2) than that observed from step-graded $In_xGa_{1-x}As$ metamorphic buffer layer structures.

In other embodiments, the surface roughness of at least one surface of the metamorphic buffer layer structure (e.g., the surface nearest the quantum cascade structure) is reduced by the use of post-growth Chemical-Mechanical Polishing (CMP), prior to the growth of the quantum cascade structures over the metamorphic buffer layer structure. Atomic force microscopy images indicate that the CMP process reduced the surface roughness of a step-graded $In_xGa_{1-x}As$ metamorphic buffer layer structure from ~7.3 nm (as-grown) to 2.3 nm post CMP. A post-CMP ozone/HF treatment removed silica residue remaining on the surface from the CMP process, allowing for the growth of layers of the quantum cascade structure on top of the metamorphic buffer layer structure surface subjected to CMP. As noted above, after the initial growth of the metamorphic buffer layer structure, there was visible surface crosshatching. After CMP, this crosshatching was almost completely removed. Suitable protocols and experimental conditions for CMP are known.

It is to be noted that any of the semiconductor materials used in the substrate, metamorphic buffer layer structure or quantum cascade structure may be doped or undoped. By way of example only, recitation of "a quantum well of InGaAs" does not preclude that quantum well from being doped.

Various combinations of the disclosed substrates, metamorphic buffer layer structures, and quantum cascade structures are possible. By way of example only, in some embodiments, the substrate is GaAs; the metamorphic buffer layer structure includes $In_xGa_{1-x}As$ wherein x is graded from 0 to 0.1; and the quantum cascade structure includes quantum wells of $In_xGa_{1-x}As$ wherein $0.1 \leq x \leq 0.5$ and barriers of $In_yAl_{1-y}As$ wherein $0 \leq y \leq 0.1$. In other embodiments, the substrate is GaAs; the metamorphic buffer layer structure includes $In_xGa_{1-x}As$ wherein x is graded from 0 to 0.3; and the quantum cascade structure includes quantum wells of $In_xGa_{1-x}As$ wherein $0.3 \leq x \leq 0.7$ and barriers of $In_yAl_{1-y}As$ wherein $0 \leq y \leq 0.3$. In other embodiments, the substrate is GaAs; the metamorphic buffer layer structure includes $In_xGa_{1-x}As$ wherein x is graded from 0 to 0.4; and the quantum cascade structure includes quantum wells of $In_xGa_{1-x}As$ wherein $0.4 \leq x \leq 0.8$ and barriers of $In_yAl_{1-y}As$ wherein $0 \leq y \leq 0.4$. Other combinations are possible.

Methods

Also provided are methods for forming any of the disclosed semiconductor structures, quantum cascade structures and metamorphic buffer layer structures. Metal-organic chemical vapor deposition (MOCVD) may be used to grow any of the disclosed metamorphic buffer layer structures over any of the disclosed substrates and to grow any of the disclosed quantum cascade structures over the metamorphic buffer layer structures.

By way of example only, for those embodiments involving GaAs substrates, step-graded $In_xGa_{1-x}As$ or step-graded $InGaP_{1-x}Sb_x$ metamorphic buffer layer structures, and InGaAs/AlInAs quantum cascade structures, a multi-wafer (three 2" wafers) Thomas Swan MOCVD system with a close-coupled showerhead reactor operating at a low pressure of 50-100 Torr may be used. Trimethylgallium (($CH_3)_3Ga$, TMGa), Trimethylindium(($CH_3)_3In$, TMIn) and Trimethylaluminum(($CH_3)_3Al$, TMAl) may be used for Ga, In, and Al precursors respectively. Triethylantimony (TESb), $AsH_3$ and $PH_3$ may be used as group V sources, and $SiH_4$ or $Si_2H_6$ may be used for the n-type doping source. After loading into the reactor, substrates may be thermally cleaned in $AsH_3$ ambient for 5 min at ~600° C. and a GaAs buffer layer may be grown prior to the growth of the metamorphic buffer layer structure. The growth temperature may be in the range of 500-600° C. for the metamorphic buffer layer structure (although higher temperatures are possible, e.g., 600-700° C.) and 640° C. for the quantum cascade structures (although lower temperatures are possible, e.g., 620° C.). A growth rate of ~0.7 (InGaAs)-1.0 (AlInAs) μm/hr may be used for the active region of the quantum cascade structure. Other growth rates are possible such as ~0.36-0.58 μm/hr. These relatively slow growth rates allow for sufficient layer-thickness control to produce layers as thin as 1 nm, as verified from high-resolution transmission electron microscopy (TEM) pictures.

Solid-phase compositions of the InGaAs and AlInAs layers, as well as thicknesses, may be determined from high-resolution X-ray diffraction (HRXRD) by fitting to a dynamical simulation. HRXRD may be used to analyze the crystalline quality and layer thicknesses of the quantum cascade structures. The HRXRD determines the average strain, the period of the superlattices and the thicknesses of the individual layers. The comparison between the experimental and simulated X-ray diffraction data provides for confirmation that the crystalline quality of the structure is satisfactory. Sharp peaks in the HRXRD indicate the degree of periodicity along the growth direction. The spacing between the zero-order peak and the top of the metamorphic buffer layer structure peak provide confirmation that the quantum cascade structure is nearly perfectly lattice-matched to the underlying metamorphic buffer layer structure.

Prior to growth of the quantum cascade structures over the metamorphic buffer layer structure, CMP may be used (as described above) to reduce surface roughness.

Lasers

Also provided are lasers incorporating any of the semiconductor structures or quantum cascade structures disclosed herein. The lasers include a plurality of laser stages, each laser stage including a quantum cascade structure. The lasers may include at least 10, at least 25, at least 30, or at least 40 laser stages. The plurality of laser stages may be deposited over the metamorphic buffer layer structure and the substrate. The lasers may include other known components for configuring quantum cascade structures into lasers, e.g., an additional extractor region and electron injector region for providing a final electron Bragg mirror, a transverse optical waveguide, a substrate, and a contact layer.

The word "illustrative" or "exemplary" is used herein to mean serving as an example, instance, or illustration. Any aspect or design described herein as "illustrative" or "exemplary" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semiconductor structure comprising:
   a GaAs substrate;
   a metamorphic buffer layer structure over the substrate, the metamorphic buffer layer structure comprising one or more layers of semiconductor; and
   a quantum cascade structure over the metamorphic buffer layer structure, the quantum cascade structure comprising an electron injector, an active region adjacent to the electron injector, and an electron extractor adjacent to the active region, wherein each of the electron injector, active region and electron extractor comprise a superlattice of quantum wells and barriers.

2. The semiconductor structure of claim 1, wherein the quantum cascade structure comprises quantum wells of InGaAs and barriers of InAlAs, AlAs, or both.

3. The semiconductor structure of claim 1, wherein at least one barrier of the active region is AlAs.

4. The semiconductor structure of claim 1, wherein the quantum cascade structure comprises quantum wells of $In_xGa_{1-x}As$ and barriers of $In_yAl_{1-y}As$, and further wherein $0.10 \leq x \leq 0.80$ and $0 \leq y \leq 0.40$.

5. The semiconductor structure of claim 1, wherein the quantum wells in the quantum cascade structure are $In_xGa_{1-x}As$ and the barriers in the quantum cascade structure are $In_yAl_{1-y}As$, and further wherein $0.30 \leq x \leq 0.70$ and $0 \leq y \leq 0.30$.

6. The semiconductor structure of claim 1, wherein each of the quantum wells of the active region are deep quantum wells characterized by well bottoms which are lower in energy than the well bottoms of the quantum wells of the electron injector, and further wherein at least one of the deep quantum wells has a well bottom which remains lower in energy than the well bottom of another deep quantum well of the active region when the semiconductor structure is unbiased.

7. The semiconductor structure of claim 1, wherein the quantum cascade structure is characterized by an energy band offset of at least 1.20 eV.

8. The semiconductor structure of claim 1, wherein the quantum cascade structure is characterized by an ability to emit light at a wavelength of 4.5 μm or less when under the influence of an applied electric field.

9. The semiconductor structure of claim 1, wherein the metamorphic buffer layer structure comprises InGaAs.

10. The semiconductor structure of claim 1, wherein the metamorphic buffer layer structure comprises $In_xGa_{1-x}As$, and further wherein x is graded from 0 to 0.3.

11. A laser comprising the semiconductor structure of claim 1 and a plurality of laser stages, wherein each laser stage comprises the quantum cascade structure and the plurality of laser stages is over the metamorphic buffer layer structure.

12. A semiconductor structure comprising:
    a GaAs substrate;
    a metamorphic buffer layer structure over the substrate, the metamorphic buffer layer structure comprising one or more layers of semiconductor; and
    a quantum cascade structure over the metamorphic buffer layer structure, the quantum cascade structure comprising an electron injector, an active region adjacent to the electron injector, and an electron extractor adjacent to the active region, wherein each of the electron injector, active region and electron extractor comprise a superlattice of quantum wells and barriers,
    wherein the quantum cascade structure comprises quantum wells of InGaAs and barriers of InAlAs, AlAs, or both, and wherein the quantum wells are compressively strained and are characterized by a strain*thickness value in the range of 0 Å to 0.60 Å and the barriers are tensilely strained and are characterized by a strain*thickness value in the range of 0 Å to 0.46 Å.

13. A semiconductor structure comprising:
    a GaAs substrate;
    a metamorphic buffer layer structure over the substrate, the metamorphic buffer layer structure comprising one or more layers of semiconductor; and
    a quantum cascade structure over the metamorphic buffer layer structure, the quantum cascade structure comprising an electron injector, an active region adjacent to the electron injector, and an electron extractor adjacent to the active region, wherein each of the electron injector, active region and electron extractor comprise a superlattice of quantum wells and barriers,
    wherein the quantum cascade structure is characterized by an energy band offset of at least 1.20 eV, wherein the exit barrier is tensilely strained and characterized by a strain*thickness value in the range of 0 Å to 0.46 Å or the adjacent, upstream quantum well is compressively strained and characterized by a strain*thickness value in the range of 0 Å to 0.60 Å or both.

14. A laser comprising a semiconductor structure and a plurality of laser stages, the semiconductor structure comprising
    a GaAs substrate;
    a metamorphic buffer layer structure over the substrate, the metamorphic buffer layer structure comprising one or more layers of semiconductor; and
    a quantum cascade structure over the metamorphic buffer layer structure, the quantum cascade structure comprising an electron injector, an active region adjacent to the electron injector, and an electron extractor adjacent to the active region, wherein each of the electron injector, active region and electron extractor comprise a superlattice of quantum wells and barriers,
    wherein each laser stage comprises the quantum cascade structure and the plurality of laser stages is over the metamorphic buffer layer structure, and wherein the quantum cascade structure is configured to provide the laser characterized by an ability to lase at a wavelength of 4.5 μm or less, a value of $P_{CW,max}$ at room temperature of at least 1.5 W and a value of $\eta_{wp,max}$ at room temperature of at least 10% when under the influence of an applied electric field.

15. A semiconductor structure comprising:
    a GaAs substrate;
    a metamorphic buffer layer structure over the substrate, the metamorphic buffer layer structure comprising one or more layers of semiconductor; and a quantum cascade structure over the metamorphic buffer layer structure, the quantum cascade structure comprising an electron injector, an active region adjacent to the electron injector, and an electron extractor adjacent to the active region, wherein each of the electron injector, active region and electron extractor comprise a superlattice of quantum wells and barriers, further wherein the quantum cascade structure comprises quantum wells of InGaAs and barriers of InAlAs, AlAs, or both, and further wherein, the quantum cascade structure is characterized by an ability to emit light at a wavelength of 4.5 µm or less when under the influence of an applied electric field.

16. The semiconductor structure of claim 15, wherein the quantum wells in the quantum cascade structure are $In_xGa_{1-x}As$ and the barriers in the quantum cascade structure are $In_yAl_{1-y}As$, and further wherein $0.30 \leq x \leq 0.70$ and $0 \leq y \leq 0.30$.

17. The semiconductor structure of claim 16, wherein the metamorphic buffer layer structure comprises $In_xGa_{1-x}As$, and further wherein x is graded from 0 to 0.3.

18. A quantum cascade structure comprising:
an electron injector, an active region adjacent to the electron injector, and an electron extractor adjacent to the active region, wherein each of the electron injector, active region and electron extractor comprise a superlattice of quantum wells and barriers,
wherein the quantum wells in the quantum cascade structure are $In_xG_{1-x}As$ and the barriers in the quantum cascade structure are $In_xAl_{1-y}As$, wherein $0.30 \leq x \leq 0.70$ and $0 \leq y \leq 0.30$,
and further wherein the quantum cascade structure is characterized by an ability to emit light at a wavelength of less than 4.0 µm when under the influence of an applied electric field.

19. The quantum cascade structure of claim 18, wherein the quantum cascade structure has been released from a metamorphic buffer layer structure and a GaAs substrate over which it was grown.

20. The quantum cascade structure of claim 18, wherein the quantum wells are compressively strained and are characterized by a strain*thickness value in the range of 0 Å to 0.60 Å and the barriers are tensilely strained and are characterized by a strain*thickness value in the range of 0 Å to 0.46 Å.

* * * * *

UNITED STATES PATENT AND TRADEMARK OFFICE
CERTIFICATE OF CORRECTION

PATENT NO. : 8,879,595 B2  Page 1 of 1
APPLICATION NO. : 13/283855
DATED : November 4, 2014
INVENTOR(S) : Luke J. Mawst et al.

It is certified that error appears in the above-identified patent and that said Letters Patent is hereby corrected as shown below:

IN THE CLAIMS

Col. 16, Line 8 (claim 18)

Delete "$In_xG_{1-x}As$" and replace with --$In_xGa_{1-x}As$--

Signed and Sealed this
Seventh Day of July, 2015

Michelle K. Lee
*Director of the United States Patent and Trademark Office*